(12) United States Patent
Lee

(10) Patent No.: US 7,554,262 B2
(45) Date of Patent: Jun. 30, 2009

(54) DISPLAY DEVICE WITH SIGNAL LINE ELECTRODE STRUCTURE

(75) Inventor: Chun Tak Lee, Gumi (KR)

(73) Assignee: LG Display Co., Ltd., Seoul (KR)

( * ) Notice: Subject to any disclaimer, the term of this patent is extended or adjusted under 35 U.S.C. 154(b) by 576 days.

(21) Appl. No.: 11/374,975

(22) Filed: Mar. 15, 2006

(65) Prior Publication Data

US 2006/0284555 A1 Dec. 21, 2006

(30) Foreign Application Priority Data

Jun. 15, 2005 (KR) .................. 10-2005-0051554

(51) Int. Cl.
*H01J 1/62* (2006.01)
*H01J 63/04* (2006.01)

(52) U.S. Cl. .................. 313/504; 313/498; 313/506; 313/512

(58) Field of Classification Search .......... 313/498–512
See application file for complete search history.

(56) References Cited

U.S. PATENT DOCUMENTS

| 7,034,452 | B2 * | 4/2006 | Kim | 313/500 |
| 7,187,123 | B2 * | 3/2007 | MacPherson | 313/506 |
| 7,312,568 | B2 * | 12/2007 | Park | 313/504 |
| 7,355,204 | B2 * | 4/2008 | Coe | 257/72 |

* cited by examiner

*Primary Examiner*—Joseph L Williams
*Assistant Examiner*—Kevin Quarterman
(74) *Attorney, Agent, or Firm*—Morgan Lewis & Bockius LLP

(57) ABSTRACT

The disclosure describes a display device with a signal line electrode structure for preventing a scan line or a data line from being corroded. The display device comprises a substrate; a first electrode layer disposed over the substrate; a second electrode layer disposed to cover the first electrode layer and configured to electrically communicate with the first electrode layer; a pixel disposed over the substrate; and a cap attached to the substrate to cover the pixel, wherein the signal line is in electrical communication with the pixel, and includes a light transmitting apart in the sealant area.

24 Claims, 4 Drawing Sheets

Fig. 1 [Related Art]
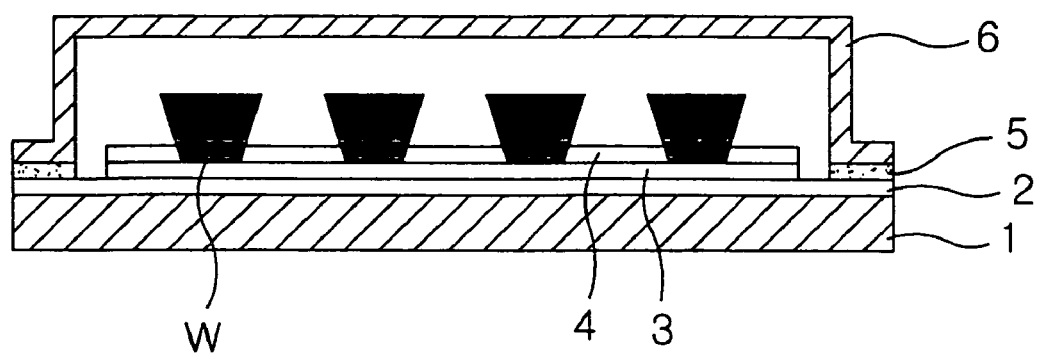
Fig. 2 [Related Art]
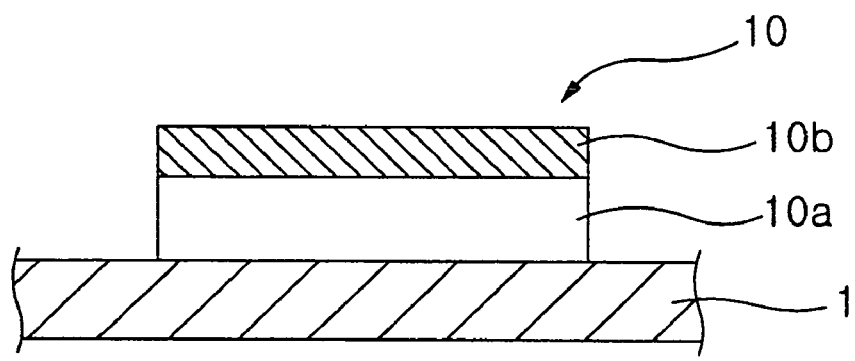

DISPLAY DEVICE WITH SIGNAL LINE ELECTRODE STRUCTURE

BACKGROUND OF THE INVENTION

1. Field of the Invention

The present invention relates to a display device for preventing corrosion of a signal line. Particularly, the present invention relates to a display device, such as an organic electroluminescent device, for preventing a scan line or a data line from being corroded.

2. Description of the Related Art

An organic electroluminescent device, one of the display devices, is a device using organic electroluminescence. Organic electroluminescence is a phenomenon that excitons are formed in an (low molecular or high molecular) organic material thin film by re-combining holes injected through an anode with electrons injected through a cathode, and a light of specific wavelength is generated by energy of the formed excitons.

FIG. 1 is a cross-sectional view of an organic electroluminescent device of the related art.

As shown in FIG. 1, the organic electroluminescent device comprises an anode electrode layer 2, an insulating layer (not shown), an organic material layer 3 and a cathode electrode layer 4, stacked in order on a glass substrate 1. A wall W is formed on the anode electrode layers 2 for partitioning the cathode electrode layers 4.

The anode electrode layer 2 is coupled to pads (not shown) disposed on an end of the substrate 1 through a data line, and the cathode electrode layer 4 is coupled to the pads through a scan line.

FIG. 2 shows a cross-sectional view of the data line or the scan line of the organic electroluminescent device, in accordance with the related art. Hereinafter, for convenience's sake, the scan line will be exemplified.

The scan line 10 comprises a scan line electrode layer 10a disposed on the substrate 1, and a sub-electrode layer 10b disposed on the scan line electrode layer 10a. Usually, ITO is used for the scan line electrode layer 10a, and molybdenum, which has a lower resistance value than ITO, is used for the sub-electrode layer 10b. Therefore, the overall resistance of the scan line 10 can be reduced.

The scan line 10 is disposed within an area applied by sealant 5 (hereinafter, referred to as "sealant area"), where a cap 6 is attached to the substrate 1. In this area, the sealant 5 is disposed between the scan line 10 and the cap 6.

After the cap 6 is attached to the substrate 1 by the sealant 5, the sealant 5 disposed between the cap 6 and the substrate 1 should be cured by ultraviolet ray passing through the substrate 1. However, the ultraviolet ray cannot pass through the sub-electrode layer 10b of the sealant area, which is made of metal.

Therefore, the sealant 5 applied on the scan line 10 is not completely cured, which weakens the attaching force between the cap 6 and the substrate 1. Therefore, the moisture contained in the air may permeate into the inside of the cap 6, and degrade the device.

In addition, the scan line 10 having a double-layer structure may be corroded by moisture contained in atmosphere or moisture contained in sealant 5. Particularly, galvanic corrosion may occur on the boundary surfaces of the scan line electrode layer 10a and the sub-electrode layer 10b.

The galvanic corrosion occurred on the boundary surfaces of the scan line electrode layer 10a and the sub-electrode layer 10b decreases the brightness of the organic electroluminescent device by increasing a resistance value of the scan line 10, and increases the power consumption of the device such that the entire performance of the device is degenerated.

SUMMARY OF THE INVENTION

An object of the present invention is to provide a display device which can prevent corrosion of a signal line in an area applied by sealant.

Another object of the present invention is to provide a display device including a signal line which can increase an area which ultraviolet ray passes through, and decrease electrical resistance.

A display device according to the present invention comprises a substrate; a first electrode layer disposed over the substrate; a second electrode layer disposed to cover the first electrode layer and configured to electrically communicate with the first electrode layer; a pixel disposed over the substrate; and a cap attached to the substrate to cover the pixel, wherein a sealant area is defined as an area of the substrate applied by sealant for attaching the cap to the substrate, wherein a signal line is defined as a structure including the first electrode layer and the second electrode layer, wherein the signal line is in electrical communication with the pixel, and includes a light transmitting part in the sealant area. Here, the second electrode layer is a transparent electrode layer.

The resistance value or the unit resistance value of material, of the first electrode layer is preferable to be smaller than that of the second electrode layer.

Preferably, the light transmitting part is at least one aperture disposed on the first electrode layer. More preferably, the at least one aperture and the substrate exposed therethrough are covered by the second electrode layer, or the at least one aperture is covered by the second electrode layer to expose the substrate through the at least one aperture.

The light transmitting part is preferable to be a structure consisting of only the second electrode layer. Also, the light transmitting part is preferable to be at least one disconnected part of the first electrode layer.

Preferably, the second electrode layer is disposed over the substrate to surround an exposed surface of the first electrode layer. Also, the second electrode layer is disposed to cover the first electrode layer along an entire length thereof, or to cover the first electrode layer for a part of length thereof.

An organic electroluminescent device according to the present invention comprises a substrate; a sub-electrode layer disposed over the substrate; a signal line electrode layer disposed to cover the sub-electrode layer and configured to electrically communicate with the sub-electrode layer, wherein the signal line electrode layer is a transparent electrode layer; an anode electrode layer disposed over the substrate; a cathode electrode layer disposed over or under the anode electrode layer; an organic material layer disposed between the anode electrode layer and the cathode electrode layer; and a cap attached to the substrate to cover the anode electrode layer, the organic material layer and cathode electrode layer, wherein a pixel area is defined as an area of the substrate covered by the anode electrode layer, the organic material layer and cathode electrode layer, wherein a sealant area is defined as an area of the substrate applied by sealant for attaching the cap to the substrate, wherein a signal line is defined as a structure including the sub-electrode layer and the signal line electrode layer, and is in electrical communication with the cathode electrode layer or the anode electrode layer, and wherein the signal line includes a light transmitting part in the sealant area. Here, the resistance value or the unit resistance value of material, of the sub-electrode layer is smaller than that of the signal line electrode layer.

The light transmitting part is preferable to be at least one aperture disposed on the sub-electrode layer, a structure consisting of only the signal line electrode layer, or at least one disconnected part of the sub-electrode layer.

The display device according to the present invention, described above, can prevent the material of the signal line from being corroded. Also, the device can prevent the reduction of brightness and the increase of power consumption.

Also, the effective cure of sealant advances the quality of sealing the cap and the substrate.

BRIEF DESCRIPTION OF THE DRAWING

FIG. 1 is a cross-sectional view of an organic electroluminescent device of the related art.

FIG. 2 shows a cross-sectional view of a scan line of the organic electroluminescent device, in accordance with the related art.

DETAILED DESCRIPTION OF THE INVENTION

Hereinafter, a display device according to the preferred embodiment of the present invention will be explained in more detail with reference to the accompanying drawings. Also, an organic electroluminescent display will be explained for explanation purposes. However, the present invention is not limited to the organic electroluminescent device.

Figure 3:
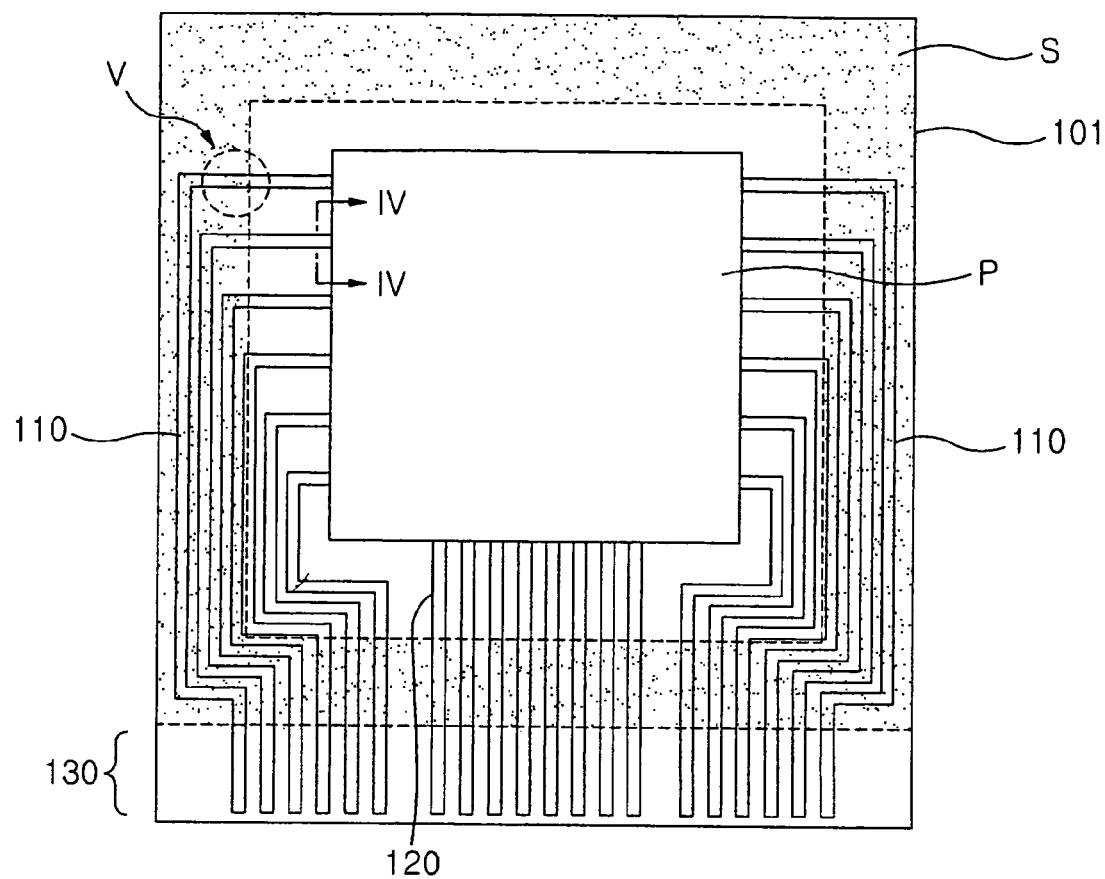
FIG. 3 is a plane view of an organic electroluminescent device according to the preferred embodiment of the present invention.

FIG. 3 is a plane view of the organic electroluminescent device according to the preferred embodiment of the present invention.

In FIG. 3, a cap is not illustrated for convenience's sake, and only a sealant area S for attaching the cap to a substrate 101 is illustrated. Here, the sealant area S is defined as an area of the substrate 101 applied by sealant for attaching the cap to the substrate 101.

Also, a pixel area P is defined as an area on the substrate 101 covered by an anode electrode layer, an organic material layer and a cathode electrode layer. The anode electrode layer, the organic material layer and the cathode electrode layer have already been explained referring to FIG. 1, and thus the explanation for them is omitted.

Although the anode electrode layer has been illustrated as being on the substrate with the cathode electrode layer being above, it would be possible to reverse this orientation for the anode electrode layer and the cathode electrode layer.

A scan line 110 is coupled to the cathode electrode layer of the pixel area P, and a data line 120 is coupled to the anode electrode layer of the pixel area P. Also, each end of the scan line 110 and data line 120 is coupled to pads 130 disposed on an end of the substrate 101.

Hereinafter, for convenience's sake, the scan line 110 will be exemplified. However, the present invention is not limited to the scan line 110.

Figure 4:
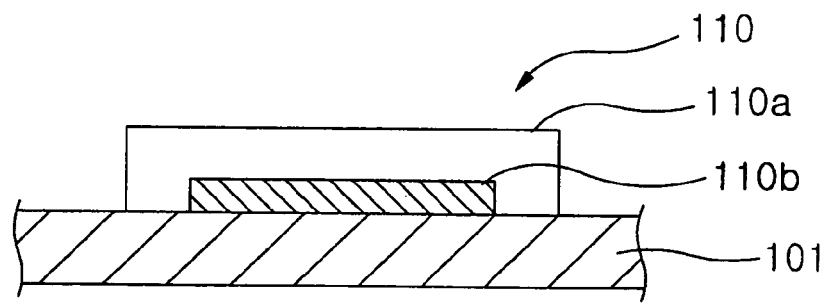
FIG. 4 is a cross-sectional view of a scan line taken along the line IV-IV of FIG. 3.

FIG. 4 is a cross-sectional view of the scan line taken along the line IV-IV of FIG. 3.

Sub-electrode layer 110b is disposed over the substrate 101. A scan line electrode layer 110a is disposed over the substrate 101 to cover the sub-electrode layer 110b, and configured to electrically communicate with the sub-electrode layer 110b.

The resistance value of the sub-electrode layer 110b is lower than that of the scan line electrode layer 110a. Also, the unit resistance value of material of the sub-electrode layer 110b is lower than that of the scan line electrode layer 110a. Molybdenum or aluminum is preferable as the sub-electrode layer 110b, and a transparent material, such as ITO, is preferable as the scan line electrode layer 110a.

As shown in FIG. 4, the scan line electrode layer 110a is disposed to completely surround the surface of the sub-electrode layer 110b. Therefore, the sub-electrode layer 110b is not exposed to the outside. Also, the scan line electrode layer 110a is preferable to surround the sub-electrode layer 10b along entire length of the sub-electrode layer 110b.

Hereinafter, a process for forming the scan line 110 will be explained.

The sub-electrode layer 110b is formed over an area where the scan line 110 will be formed, by a sputtering process and the likes. And then, during the process for forming the anode electrode layer in the pixel area P, the scan line electrode layer 110a is formed over the sub-electrode layer 110b, together with the anode electrode layer. Therefore, the scan line 110 according to the preferred embodiment of the present invention can be formed without additional processes.

By the scan line 110 of the organic electroluminescent device, having the structure described above, the following effects can be achieved.

The scan line electrode layer 110a is formed over the sub-electrode layer 110b not to make the sub-electrode layer 110b exposed such that moisture contained in atmosphere or moisture contained in sealant does not directly contact the sub-electrode layer 110b. Therefore, the sub-electrode layer 10b is not corroded.

Also, because the scan line 110 of the organic electroluminescent device according to the present invention have the structure where the sub-electrode layer 110b is not exposed to the outside by the scan line electrode layer 110a, the boundary surface of the sub-electrode layer 110b and the scan line electrode layer 110a is not exposed to the moisture. Therefore, galvanic corrosion does not occur on the boundary surface, which prevents electrical resistance of the scan line 110 from increasing.

Figure 5:
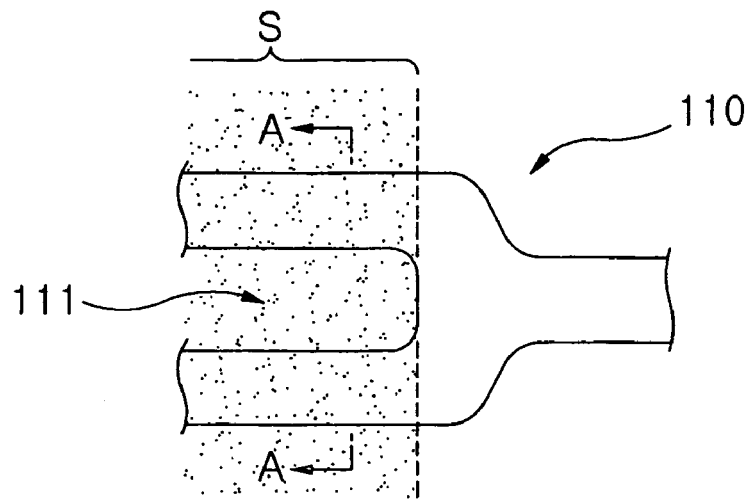
FIG. 5 is a detailed plane view of "V" section in the scan line illustrated in FIG. 3.

FIG. 5 is a detailed plane view of "V" section in the scan line illustrated in FIG. 3.

The sub-electrode layer 110b of the scan line 110 has at least one aperture 111 in the sealant area S. Therefore, a part of the substrate 101 is exposed through the aperture 111, and the area, which the ultraviolet ray for curing the sealant can pass through, is increased. This area results in curing the sealant more effectively.

Figure 6:
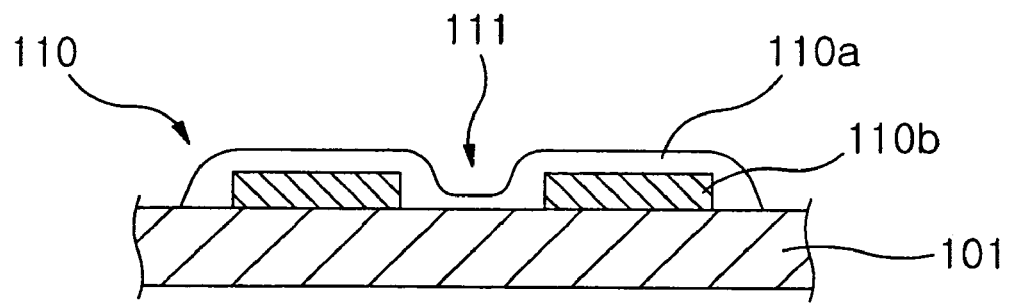
FIG. 6 is a cross-sectional view of the scan line taken along the line A-A of FIG. 5.

FIG. 6 is a cross-sectional view of the scan line taken along the line A-A of FIG. 5.

As shown in FIG. 6, the aperture 111, which the ultraviolet ray can pass through, is disposed on the sub-electrode layer 10b of the scan line 110. The sub-electrode layers 110b are covered by the scan line electrode layer 110a, and also the substrate 101 exposed through the aperture 111 is covered by the scan line electrode layer 110a. Therefore, the sub-electrode layers 110b are not exposed to the outside.

Figure 7:
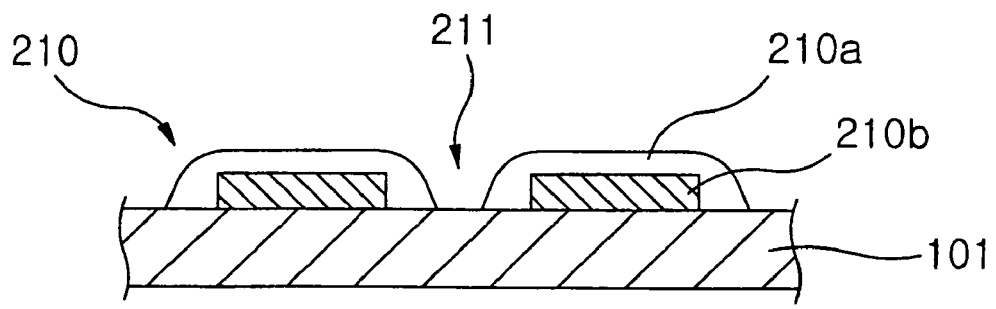
FIG. 7 is a cross-sectional view of the scan line taken along the line A-A of FIG. 5.

FIG. 7 is a cross-sectional view of the scan line taken along the line A-A of FIG. 5.

As shown in FIG. 7, the aperture 211, which the ultraviolet ray can pass through, is disposed on the sub-electrode layers 210b of the scan line 210. The sub-electrode layers 210b are covered by the scan line electrode layers 210a respectively. However, a part of the substrate 101 exposed through the aperture 211 is not covered by the scan line electrode layer 210a. Also, the sub-electrode layers 210b are not exposed to the outside.

Figure 8:
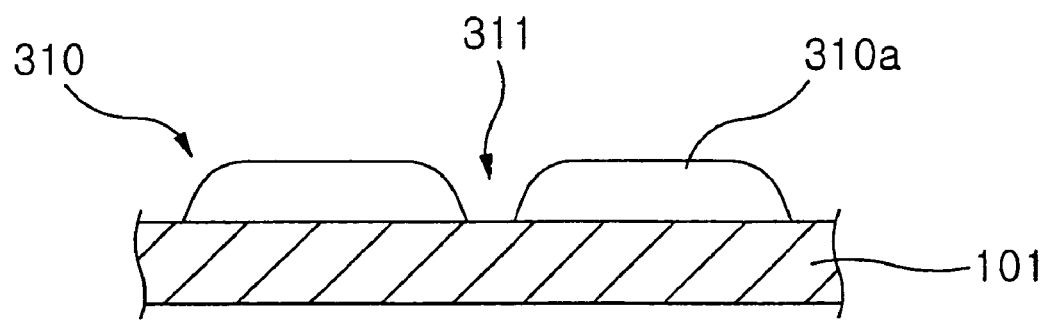
FIG. 8 is a cross-sectional view of the scan line taken along the line A-A of FIG. 5.

FIG. 8 is a cross-sectional view of the scan line taken along the line A-A of FIG. 5.

As shown in FIG. 8, the sub-electrode layer is not disposed in the scan line electrode layer 310a within the sealant area S. However, the sub-electrode layer is disposed in the scan line electrode layer 310a within the remaining area. Therefore, because only the scan line electrode layer made of ITO, which has at least one aperture 311, is disposed within the sealant area S, the ultraviolet ray can pass through the scan line 310 more effectively.

Preferably, the sub-electrode layer is disposed in a part of the scan line electrode layer 310a within the sealant area S. Also, the aperture 311 may not be disposed in the scan line electrode layer 310a within the sealant area S.

From the above preferred embodiments for the present invention, it is noted that modifications and variations can be made by a person skilled in the art in light of the above teachings. Therefore, it should be understood that changes may be made for a particular embodiment of the present invention within the scope and the spirit of the present invention outlined by the appended claims.

What is claimed is:

1. An organic electroluminescent device, comprising:
 a substrate;
 a sub-electrode layer disposed over the substrate;
 a signal line electrode layer disposed to cover the sub-electrode layer and configured to electrically communicate with the sub-electrode layer, wherein the signal line electrode layer is a transparent electrode layer;
 an anode electrode layer disposed over the substrate;
 a cathode electrode layer disposed over or under the anode electrode layer;
 an organic material layer disposed between the anode electrode layer and the cathode electrode layer; and
 a cap attached to the substrate to cover the anode electrode layer, the organic material layer and cathode electrode layer,
 wherein a pixel area is defined as an area of the substrate covered by the anode electrode layer, the organic material layer and cathode electrode layer,
 wherein a sealant area is defined as an area of the substrate applied by sealant for attaching the cap to the substrate,
 wherein a signal line is defined as a structure including the sub-electrode layer and the signal line electrode layer, and is in electrical communication with the cathode electrode layer or the anode electrode layer, and
 wherein the signal line includes a light transmitting part in the sealant area.

2. The organic electroluminescent device of claim 1, wherein the light transmitting part is at least one aperture disposed on the sub-electrode layer.

3. The organic electroluminescent device of claim 2, wherein the at least one aperture and the substrate exposed therethrough are covered by the signal line electrode layer.

4. The organic electroluminescent device of claim 2, wherein the at least one aperture is covered by the signal line electrode layer to expose the substrate through the at least one aperture.

5. The organic electroluminescent device of claim 1, wherein the light transmitting part is a structure consisting of only the signal line electrode layer.

6. The organic electroluminescent device of claim 1, wherein the light transmitting part is at least one disconnected part of the sub-electrode layer.

7. The organic electroluminescent device of claim 1, wherein the resistance value of the sub-electrode layer is smaller than that of the signal line electrode layer.

8. The organic electroluminescent device of claim 1, wherein the unit resistance value of material of the sub-electrode layer is smaller than that of the signal line electrode layer.

9. The organic electroluminescent device of claim 1, wherein the signal line electrode layer and the anode electrode layer are formed from same material through same process.

10. The organic electroluminescent device of claim 1, wherein the signal line electrode layer is disposed over the substrate to surround an exposed surface of the sub-electrode layer.

11. The organic electroluminescent device of claim 1, wherein the signal line electrode layer is disposed to cover the sub-electrode layer along an entire length thereof.

12. The organic electroluminescent device of claim 1, wherein the signal line electrode layer is disposed to cover the sub-electrode layer for a part of length thereof.

13. A display device, comprising:
 a substrate;
 a first electrode layer disposed over the substrate;
 a second electrode layer disposed to cover the first electrode layer and configured to electrically communicate with the first electrode layer;
 a pixel disposed over the substrate; and
 a cap attached to the substrate to cover the pixel,
 wherein a sealant area is defined as an area of the substrate applied by sealant for attaching the cap to the substrate,
 wherein a signal line is defined as a structure including the first electrode layer and the second electrode layer,
 wherein the signal line is in electrical communication with the pixel, and includes a light transmitting part in the sealant area.

14. The display device of claim 13, wherein the second electrode layer is a transparent electrode layer.

15. The display device of claim 14, wherein the light transmitting part is a structure consisting of only the second electrode layer.

16. The display device of claim 14, wherein the light transmitting part is at least one disconnected part of the first electrode layer.

17. The display device of claim 13, wherein the light transmitting part is at least one aperture disposed on the first electrode layer.

18. The display device of claim 17, wherein the at least one aperture and the substrate exposed therethrough are covered by the second electrode layer, and
 wherein the second electrode layer is a transparent electrode layer.

19. The display device of claim 17, wherein the at least one aperture is covered by the second electrode layer to expose the substrate through the at least one aperture.

20. The display device of claim 13, wherein the second electrode layer is disposed over the substrate to surround an exposed surface of the first electrode layer.

21. The display device of claim 13, wherein the second electrode layer is disposed to cover the first electrode layer along an entire length thereof.

22. The display device of claim 13, wherein the second electrode layer is disposed to cover the first electrode layer for a part of length thereof.

23. The display device of claim 13, wherein the resistance value of the first electrode layer is smaller than that of the second electrode layer.

24. The display device of claim 13, wherein the unit resistance value of material of the first electrode layer is smaller than that of the second electrode layer.

* * * * *